United States Patent
Masanori

[11] Patent Number: 5,834,363
[45] Date of Patent: Nov. 10, 1998

[54] METHOD OF MANUFACTURING SEMICONDUCTOR WAFER, SEMICONDUCTOR WAFER MANUFACTURED BY THE SAME, SEMICONDUCTOR EPITAXIAL WAFER, AND METHOD OF MANUFACTURING THE SEMICONDUCTOR EPITAXIAL WAFER

[75] Inventor: Mayuzumi Masanori, Annaka, Japan

[73] Assignee: Shin-Etsu Handotai Co., Ltd., Tokyo, Japan

[21] Appl. No.: 826,137

[22] Filed: Mar. 27, 1997

[30] Foreign Application Priority Data

Mar. 28, 1996 [JP] Japan .................................. 8-099369
Mar. 28, 1996 [JP] Japan .................................... 899367

[51] Int. Cl.$^6$ .................................................. H01L 21/20
[52] U.S. Cl. .......................... 438/507; 438/478; 148/175; 117/90
[58] Field of Search .................................. 438/478, 507; 148/175; 117/90

[56] References Cited

U.S. PATENT DOCUMENTS

| 4,662,956 | 5/1987 | Roth et al. ............................. 148/175 |
| 4,925,809 | 5/1990 | Yoshiharu et al. . |
| 5,296,385 | 3/1994 | Moslehi et al. . |
| 5,562,770 | 10/1996 | Chen et al. ............................ 117/90 |

FOREIGN PATENT DOCUMENTS

| 56-071928 | 6/1981 | Japan . |
| 58-095819 | 6/1983 | Japan . |
| 59-027529 | 2/1984 | Japan . |
| 63-204732 | 8/1988 | Japan . |
| 01246822 | 10/1989 | Japan . |
| 02138738 | 5/1990 | Japan . |
| 02170430 | 7/1990 | Japan . |
| 02197128 | 8/1990 | Japan . |

OTHER PUBLICATIONS

EPO European Search Report Dated Jun. 18, 1998.
R. Reif et al., Plasma Enhanced Chemical Vapor Deposition, in Thin Film Processes II edited by J. Vossen et al., Academic Press, pp. 537–541 (no month available), 1991.

Primary Examiner—Chandra Chaudhari
Assistant Examiner—Keith Christianson
Attorney, Agent, or Firm—Loeb & Loeb LLP

[57] ABSTRACT

There is disclosed a method of manufacturing a semiconductor wafer which has a dopant evaporation preventive film formed on one of main surfaces thereof, wherein a film serving as the dopant evaporation preventive film is formed on the one of the main surface by a plasma CVD method. There is also disclosed a method of manufacturing a semiconductor wafer having a plasma CVD film on one of main surfaces, wherein the plasma CVD film is formed on the one of the main surfaces of the semiconductor wafer so that a stress between the plasma CVD film and the semiconductor wafer falls in a range of $1 \times 10^8 – 1 \times 10^9$ dyne/cm$^2$. Finally, a semiconductor wafer is disclosed having a plasma CVD film formed on only one face that serves as a barrier to autodoping during processing and which may function to create within the semiconductor wafer a strained layer that can getter impurities.

15 Claims, 3 Drawing Sheets

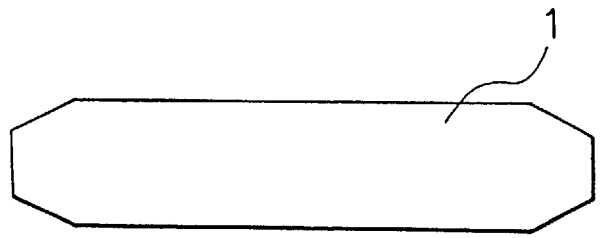
FIG. IA
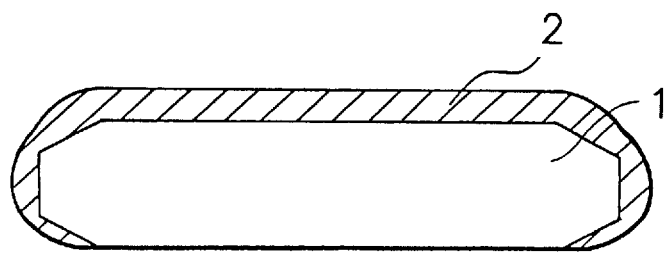
FIG. IB
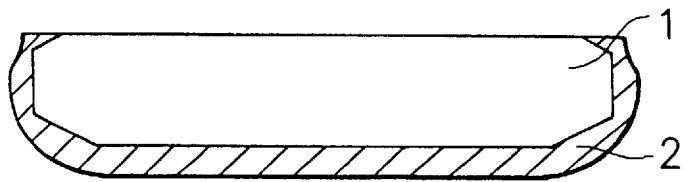
FIG. IC
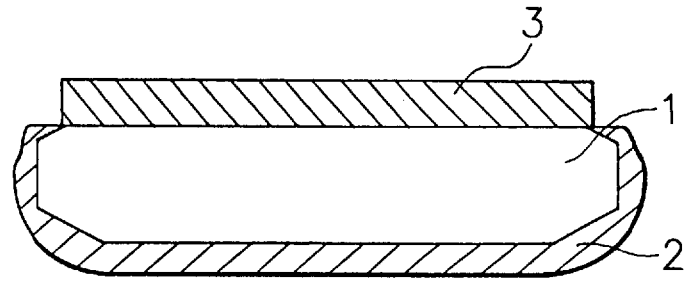
FIG. ID

METHOD OF MANUFACTURING SEMICONDUCTOR WAFER, SEMICONDUCTOR WAFER MANUFACTURED BY THE SAME, SEMICONDUCTOR EPITAXIAL WAFER, AND METHOD OF MANUFACTURING THE SEMICONDUCTOR EPITAXIAL WAFER

BACKGROUND OF THE INVENTION

1. Field of the Invention

This invention relates to a method of manufacturing a semiconductor wafer and a semiconductor wafer manufactured by the method, and particularly to a method of manufacturing a semiconductor wafer having a film formed through plasma chemical vapor deposition (hereinafter referred to as plasma CVD) and a semiconductor wafer manufactured by the method. Further, the present invention relates to a semiconductor epitaxial wafer, or a semiconductor wafer on which an epitaxial layer is grown, and a method of manufacturing the same.

2. Description of the Related Art

In an epitaxial growth process wherein a thin monocrystalline silicon film is grown on a silicon wafer in gas phase, the silicon wafer is usually exposed to a high temperature of not less than 1000° C. During this process, a dopant evaporated from the silicon wafer is incorporated into a growing epitaxial layer through a gas phase. This phenomenon is typically termed autodoping. When autodoping is prominent, an epitaxial layer having a desired resistivity cannot be obtained. Consequently, a semiconductor element having this epitaxial layer becomes defective due to a failure to exhibit designed characteristics.

Autodoping becomes prominent when the resistivity of a silicon wafer is relatively low. Therefore, according to a generally employed method, when an epitaxial layer is formed on a wafer having a relatively low resistivity, a silicon oxide film (hereinafter abbreviated to an "oxide film"), serving as a film that prevents autodoping (a dopant evaporation preventive film), is formed on one of the main surfaces of a silicon wafer (hereinafter referred to as a "back surface") on which no epitaxial layer is grown.

A conventionally used oxide film to be formed on the back surface is:

1) an atmospheric pressure chemical vapor deposition (atmospheric pressure CVD) oxide film grown in an atmospheric pressure CVD system, or
2) a thermal oxide film grown through oxidation within a heat treatment furnace.

However, either of the oxide films causes a relatively large stress to a silicon wafer, resulting in a potential warpage of the silicon wafer or crystal defects in the silicon wafer. Furthermore, in the case of a thermal oxide film, since a dopant doped in a silicon wafer is incorporated into the thermal oxide film during the formation of the thermal oxide film, autodoping occurs due to dopant being released from the thermal oxide film during a subsequent epitaxial growth process. Therefore, the thermal oxide film fails to properly function as a film that prevents autodoping.

In addition, when either of the oxide films is formed, the oxide film is formed not only on the back surface of a silicon wafer but also on the other main surface (hereinafter referred to as a "front surface") on which an epitaxial layer is grown. Accordingly, after completion of a process of forming the oxide film, the oxide film formed on the front surface must be removed.

An oxide film formed on the front surface is generally removed by polishing. However, since the polishing speed of an oxide film is much slower than the polishing speed of a silicon, it takes a very long time to polish off a thermal oxide film which covers the entire front surface of a silicon wafer. Furthermore, uneven polishing is very likely to occur, resulting in a decreased degree of flatness of the silicon wafer. In the case of an atmospheric pressure CVD oxide film, which is formed partially extending onto the front surface, polishing off such an excess portion of the oxide film also causes the degree of the flatness of a silicon wafer to decrease.

In order to avoid these problems, etching off an oxide film only from the front surface while protecting an oxide film on the back surface may be performed. Alternatively, an oxide film may be removed from the front surface by surface grinding, and then the front surface may be polished. However, these methods require an additional process, resulting in an increased cost of manufacture.

Along with a recent tendency to increase the degree of integration and precision of semiconductor devices, there has been an increasing demand for silicon wafers having a diameter of not less than 200 mm. When an epitaxial layer is to be grown on a silicon wafer having a large diameter of not less than 200 mm, a low temperature epitaxial growth process is applied in order to obtain a uniform thickness and a uniform resistivity distribution in an epitaxial layer, to reduce a transition width (the width of a region which is located in the vicinity of the boundary between an epitaxial layer and a silicon wafer, each having a different dopant concentration, and in which a dopant concentration transits), to reduce contamination with metal atoms, etc. In order to obtain such a quality, a wafer subjected to a low temperature epitaxial growth process is required to further improve its degree of flatness and reduce its warpage as compared with a wafer to be subjected to a conventional high temperature epitaxial growth process.

However, as mentioned previously, when an atmospheric pressure CVD oxide film or a thermal oxide film is used as a protective film formed on the back surface of a silicon wafer, the degree of flatness of a front surface deteriorates, and a relatively large stress acts on the silicon wafer, resulting in an increased warpage of the silicon wafer. This effect is particularly noticeable with a silicon wafer having a large diameter. Therefore, there arises a problem when such a wafer is subjected to a photolithographic process, which strictly requires a high degree of flatness. Further, too large a stress causes crystal defects in a wafer.

A layer formed on the back surface of a silicon wafer is also utilized as a gettering layer for gettering heavy metals and the like.

Gettering is a technique for collecting impurities, such as heavy metal, which are generated in the course of manufacturing semiconductor devices from a silicon wafer, to outside of a device region on the front surface of a silicon wafer, thereby preventing device characteristics from degradation.

According to a typical gettering method, polycrystalline silicon is deposited on the back surface of a silicon wafer to form a gettering layer. In order to deposit polycrystalline silicon so as to form a gettering layer, a low pressure CVD method is usually carried out. However, the growth of polycrystalline silicon causes stress to act on a wafer, resulting in a larger warpage of the wafer as compared with a wafer having no polycrystalline silicon layer. Also, the warpage of a wafer increases when the diameter of the wafer increases if a polycrystalline silicon layer is grown in a same condition.

Also, as a wafer having a polycrystalline silicon layer is subjected to heat treatment in the course of the fabrication of devices, the polycrystalline silicon is gradually crystallized into monocrystal, resulting in a less gettering capability.

A silicon wafer utilized from manufacturing semiconductor devices is required to have and maintain a gettering capability during the manufacture of semiconductor devices. In this connection, there is a problem that the warpage of a wafer increases with the diameter of the wafer.

In order to improve a gettering capability, in a silicon wafer having a polycrystalline silicon layer as a gettering layer on the back surface thereof, a stress acting on the wafer must be increased. Therefore, an improvement in the gettering capability and a reduction in stress, i.e. a reduction in warpage, cannot be achieved simultaneously. Furthermore, as heat treatment progresses during the manufacture of semiconductor devices, a polycrystalline silicon layer is gradually crystallized into monocrystal, resulting in difficulty in maintaining the gettering capability.

When an epitaxial layer is to be formed on a silicon wafer having a low dopant concentration, formation of a gettering layer on the back surface of the wafer is sufficient because there is no problem of autodoping. However, when a silicon wafer having a high dopant concentration is used, a protective film which has both a gettering capability and an autodoping preventive capability must be formed on the back surface of the wafer.

However, when a polycrystalline silicon layer is formed on a back surface of a silicon wafer having a high dopant concentration, a gettering effect is obtained, but an autodoping preventive capability is not obtained, since a dopant released from the silicon wafer readily diffuses through the polycrystalline silicon layer.

When an atmospheric pressure CVD oxide film is formed on a silicon wafer, an effect that prevents autodoping is obtained, and a gettering effect is also obtained since a stress acts between the silicon wafer and the oxide film. However, due to difficulty in controlling the stress, the warpage of the silicon wafer tends to be increased.

SUMMARY OF THE INVENTION

This invention has been accomplished in view of the above-mentioned problems, and it is an object of the present invention to provide an improved semiconductor wafer having an autodoping preventive film, in which even when the semiconductor wafer has a large diameter of not less than 200 mm, the stress acting to the wafer and resultant warpage of the wafer can be decreased while maintaining a uniform thickness distribution, a uniform resistivity distribution and a narrow transition width of an epitaxial layer grown on the semiconductor wafer, and in which the front surface of the semiconductor wafer can have an excellent degree of flatness without requiring an extra process such as a process of etching off an oxide film from the front surface.

Another object of the present invention is to provide a semiconductor wafer which has an excellently persistent gettering capability, an autodoping preventive capability and a small stress acting thereon with a resultant small warpage thereof.

A further object of the present invention is to provide a semiconductor epitaxial wafer comprising the above-described semiconductor wafer and an epitaxial layer grown thereon, and a method of manufacturing the same.

According to an aspect of the present invention, there are provided:

1) a method of manufacturing a semiconductor wafer which has a dopant evaporation preventive film formed on one of main surfaces thereof, wherein a film serving as the dopant evaporation preventive film is formed on the one of the main surfaces by a plasma CVD method;

2) a method of manufacturing a semiconductor wafer in which a dopant evaporation preventive film is formed on one of main surfaces and a semiconductor thin film is formed on the other main surface by epitaxial growth, wherein a film serving as the dopant evaporation preventive film is formed on the one of the main surfaces by a plasma CVD method, and the semiconductor wafer is subject to heat treatment at a temperature lower than a temperature at which the epitaxial growth of the semiconductor thin film is carried out;

3) a method of manufacturing a semiconductor wafer in which a dopant evaporation preventive film is formed on one of main surfaces, wherein in that a film serving as the dopant evaporation preventive film is formed on the one of the main surfaces by a plasma CVD method, and the other main surface is then polished; and 4) a method of manufacturing a semiconductor wafer in which a dopant evaporation preventive film is formed on one of main surfaces and a semiconductor thin film is formed on the other main surface by epitaxial growth, wherein a film serving as the dopant evaporation preventive film is formed on the one of the main surfaces by a plasma CVD method, the semiconductor wafer is subject to heat treatment at a temperature lower than a temperature at which the expitaxial growth of the semiconductor thin film is carried out, and the other main surface is then polished.

Preferably, the dopant evaporation preventive film is selected from a group consisting of silicon oxide film, silicon nitride film and silicon oxynitride film.

Preferably, the dopant evaporation preventive film is formed such that a stress between the dopant evaporation preventive film and the semiconductor wafer becomes equal to or less than $1 \times 10^7$ dyne/cm$^2$.

According to the above-described aspect of the present invention, it is possible to provide a semiconductor wafer having a dopant evaporation preventive film on the back surface of the wafer, in which the stress acting to the wafer and resultant warpage of the wafer can be decreased even when the wafer has a large diameter, while maintaining a uniform thickness distribution, a uniform resistivity distribution and a narrow transition width of an epitaxial layer grown on the semiconductor wafer, and in which the front surface of the semiconductor wafer can have an excellent flatness without requiring an extra process.

Another aspect of the present invention, there are provided the following methods of manufacturing a semiconductor wafer:

5) a method of manufacturing a semiconductor wafer having a plasma CVD film on one of main surfaces, wherein the plasma CVD film is formed on the one of the main surfaces of the semiconductor wafer so that a stress between the plasma CVD film and the semiconductor wafer falls in a range of $1 \times 10^8 - 1 \times 10^9$ dyne/cm$^2$; and 6) a method of manufacturing a semiconductor wafer having a plasma CVD film on one of main surfaces, wherein the plasma CVD film is formed on the one of the main surfaces of the semiconductor wafer, and the semiconductor wafer is then subjected to heat treatment so that a stress between the plasma CVD film and the semiconductor wafer falls in a range of $1 \times 10^8 - 1 \times 10^9$ dyne/cm$^2$.

The other main surface of the semiconductor wafer on which the plasma CVD film has not been formed is generally polished after the formation of the plasma CVD film or after the heat treatment of the semiconductor wafer. In the method of the present aspect, however, the plasma CVD film may be formed on the one of the main surfaces after the other main surface has been mirror-polished.

Preferably, the plasma CVD film is selected from a group consisting of silicon oxide film, silicon nitride film and silicon oxynitride film, because these films have excellent autodoping preventing effects, and their source gases are generally available.

According to the aspect of the present invention, it is possible to provide a semiconductor wafer which has an excellently persistent gettering capability and an autodoping preventive capability and a small stress acting thereon with a resultant small warpage thereof.

According to another aspect of the present invention, there are provided a semiconductor wafer manufactured by one of the above-described method, and a semiconductor epitaxial wafer manufactured by one of the above-described method in which a semiconductor thin film is formed by epitaxial growth, on the other main surface of the semiconductor wafer on which the plasma CVD film is not formed.

According to still another aspect of the present invention, there is provided a method of manufacturing a semiconductor epitaxial wafer, wherein a plasma CVD film is formed on one of main surfaces of a semiconductor wafer, and a semiconductor thin film is formed by epitaxial growth on the other main surface on which the plasma CVD film is not formed.

BRIEF DESCRIPTION OF THE DRAWINGS

FIGS. 1A–1C are schematic diagrams showing a method of manufacturing a semiconductor wafer according to the present invention;

FIG. 1D is a schematic diagram showing an epitaxial wafer manufactured using the semiconductor wafer shown in FIG. 1C;

DESCRIPTION OF PREFERRED EMBODIMENTS

Figure 2A:
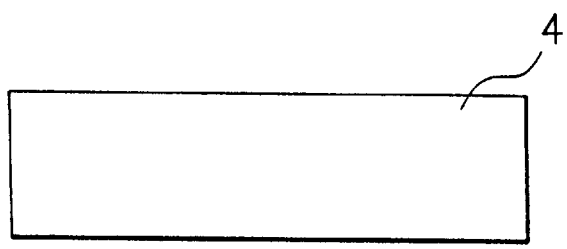
FIGS. 2A–2D are schematic diagram showing another method of manufacturing a semiconductor wafer according to the present invention, wherein the portion above a broken line in FIG. 2D indicates a portion to be removed by mirror polishing.

Embodiments of the present invention will now be described with reference to the drawings.

First Embodiment

First, a semiconductor wafer 1 manufactured by a known method is prepared as shown in FIG. 1A. For this semiconductor wafer, a chemically-etched wafer that has not yet been subjected to mirror-polishing is normally used, but a polished wafer having one or both of the main surfaces thereof mirror polished might alternatively be used.

Subsequently, as shown in FIG. 1B, a plasma CVD film 2 is deposited on one of the main surfaces of the thus-prepared semiconductor wafer by using a parallel-plate-type plasma CVD system. Although the kind of plasma CVD film to be deposited on the wafer is not limited, silicon oxide film, silicon nitride film or silicon oxynitride film is suitable because these films can be formed by using gases of generally available.

The deposition conditions are controlled such that the deposition temperature falls within the range of 300°–450° C., the deposition pressure falls within the range of 1–10 torr, and the deposition film thickness falls within the range of 100–500 nm, and so that the stress of the plasma CVD film applied to the semiconductor wafer preferably becomes equal to or less than $1 \times 10^7$ dyne/cm$^2$. The magnitude of the stress can be measured in a non-destructive manner by use of a commercially available laser Raman spectrophotometer, which projects a laser beam onto the plasma CVD film.

After the deposition of the plasma CVD film, as shown in FIG. 1C, the other main surface opposite to the surface on which the plasma CVD has been deposited is mirror-polished, whereby a desired semiconductor wafer having an autodoping preventive film can be obtained. Since the plasma CVD film deposited on the surface can be polished off at a much higher speed as compared to the case where a thermal oxide film or an atmospheric pressure CVD oxide film is polished, the plasma CVD film can be easily removed by mirror polishing. Consequently, the flatness of the semiconductor wafer can be maintained.

In the case where the surface opposite to the surface on which a plasma CVD film is to be deposited has been mirror-finished, a subsequent polishing process can be omitted if the plasma CVD is prevented from depositing on the mirror-finished surface.

Moreover, as shown in FIG. 1D, an epitaxial layer 3 is grown on the semiconductor wafer obtained through the above-described steps, at a low temperature equal to or less than 1000° C. and by use of a commercially available epitaxial reactor, so that a desired epitaxial wafer with a slight warpage can be obtained.

When the wafer on which the plasma CVD has been deposited is heat treated, before the mirror-polishing step, at a temperature lower than the temperature of the subsequently-performed epitaxial growth, the plasma CVD film is baked and hardened, so that a protective film having a higher autodoping preventive capability can be obtained. The reason why the heat treatment temperature is set to a temperature lower than the expitaxial growth temperature is to reduce the stress caused by the hardened plasma CVD film onto the semiconductor wafer.

EXAMPLE 1

Three kinds of silicon wafers were prepared from a silicon ingot manufactured by the Czochralski method (each wafer had a diameter of 200 mm, a {100} main surface, a thickness of 750 μm, a p-type conductivity, and a resistivity of 0.01 Ω.cm). Plasma CVD films (either silicon oxide film, silicon nitride film or silicon oxynitride film) were deposited on each of the first main surface of the wafers by use of a plasma CVD reactor using radio-frequency of 13.56 MHz (Concept-One, product of Novellus Systems Inc.).

When a silicon oxide film was formed as a plasma CVD film, monosilane and nitrous oxide were supplied as source materials to a plasma reaction chamber while nitrogen was used as a carrier gas, and the silicon oxide film was deposited until its thickness reached 500 nm at a growth temperature of 425° C. and a growth pressure of 3 torr. At this time, a high frequency power of 700 W was supplied to an upper plate located above a wafer in the plasma reaction chamber, while a low frequency power of 300 W was supplied to a lower plate located below the wafer, so that the stress of the silicon oxide film applied to the wafer became equal to or less than $1 \times 10^7$ dyne/cm$^2$.

When a silicon nitride film was formed as a plasma CVD film, monosilane and ammonia were used as source materials. The formation of the silicon nitride film was carried out under the same conditions as for the silicon oxide film until the thickness reached 100 nm so that the stress of the silicon nitride film applied to the wafer became equal to or less than $1 \times 10^7$ dyne/cm$^2$.

When a silicon oxynitride film was formed as a plasma CVD film, monosilane, nitrous oxide, and ammonia were used as source materials. The formation of the silicon oxynitride film was carried out under the same conditions as for the silicon oxide film until the thickness reached 300 nm so that the stress of the silicon oxynitride film applied to the wafer became equal to or less than $1 \times 10^7$ dyne/cm$^2$.

The thus-obtained wafers of the three kinds were observed to have little warpage when the stress acting thereon was equal to or less than $1 \times 10^7$ dyne/cm$^2$.

Subsequently, the second surface of each wafer opposite to the first surface on which the plasma CVD was deposited was polished, and an epitaxial film having a thickness of 4 $\mu$m was grown at low-temperature of 800° C. In each of the cases where any kinds of the plasma CVD films abovementioned were formed, the resistivity distribution of the silicon epitaxial layer within the wafer surface was equal to or less than ±5%. The transition width of the silicon epitaxial layer became equal to or less than the half of that of an epitaxial layer deposited at 1100° C. This occurred because dopant in the silicon wafer was prevented from evaporating at the back surface of the wafer not to cause autodoping, and the solid-phase diffusion of the dopant into the epitaxial layer was decreased. The amount of an increase in the warpage of the wafer after the formation of the epitaxial layer compared to the warpage before the formation of the epitaxial layer was as low as 5 $\mu$m or less.

The resistivity was measured at nine points within the wafer surface, and the resistivity distribution was calculated in accordance with the following equation:

$$\text{Resistivity distribution } (\%) = \pm(M-m)/(M+m)$$

where M is the maximum value of the measured resistivity, and m is the minimum value of the measured resistivity.

Second Embodiment

First, a semiconductor wafer 4 manufactured by a known method is prepared as shown in FIG. 2A. For this semiconductor wafer, a chemically-etched wafer that has not yet been subjected to mirror-polishing is generally used. However, a polished wafer having one main surface or both main surfaces thereof mirror polished may be used.

Figure 2B:
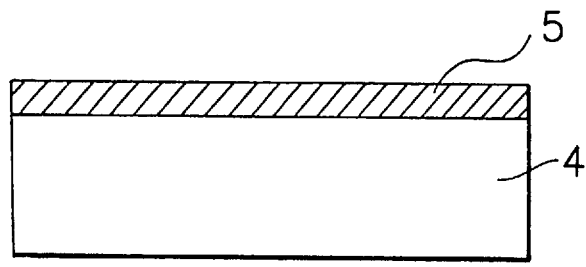

Subsequently, as shown in FIG. 2B, a plasma CVD film 5 is deposited on one of main surfaces of the thus-prepared semiconductor wafer by use of a parallel-plate-type plasma CVD reactor so that the stress of the plasma CVD film applied to the semiconductor wafer falls within a range of $1 \times 10^8 - 1 \times 10^9$ dyne/cm$^2$.

The reason why the plasma CVD film 5 is deposited so that the stress acting to the semiconductor wafer falls within the range of $1 \times 10^8 - 1 \times 10^9$ dyne/cm$^2$ is that such stress creates strained layer which captures impurities such as metals, thereby serving as a gettering layer. When the stress is less than $1 \times 10^8$ dyne/cm$^2$, sufficient gettering capability cannot be obtained. When the stress is greater than $1 \times 10^9$ dyne/cm$^2$, the warpage of the wafer increases. The magnitude of the stress can be measured in a non-destructive manner by use of a commercially available laser Raman spectrophotometer, which projects a laser beam onto the plasma CVD film.

Although there is no limitation on the kind of plasma CVD film to be deposited on the wafer, silicon oxide film, silicon nitride film or silicon oxynitride film is suitable because these films have an autodoping preventive capability and can be formed by use of generally available gasses.

The deposition of the plasma CVD film is usually performed such that the deposition temperature falls within a range of 300°–450° C., the deposition pressure falls within a range of 1–10 torr, and the deposition film thickness falls within a range of 100–500 nm. Within these ranges, the deposition conditions are controlled so that the stress which the plasma CVD film applies to the semiconductor wafer falls within a range of $1 \times 10^8 - 1 \times 10^9$ dyne/cm$^2$.

Figure 2C:
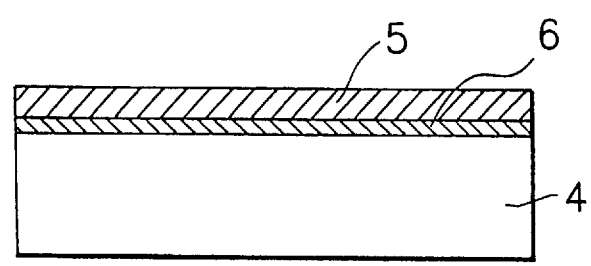

Alternatively, after the deposition of the plasma CVD film 5, the silicon wafer may be subjected to heat treatment so that the stress acting between the plasma CVD film and the semiconductor wafer falls within a range of $1 \times 10^8 - 1 \times 10^9$ dyne/cm$^2$, thereby forming a strained layer 6 as shown in FIG. 2C.

Even when the thus-formed plasma CVD film undergoes heat treatment during fabrication of semiconductor devices, the stress acting to the semiconductor wafer does not decrease but rather increase slightly, so that the gettering capability does not decrease.

Figure 2D:
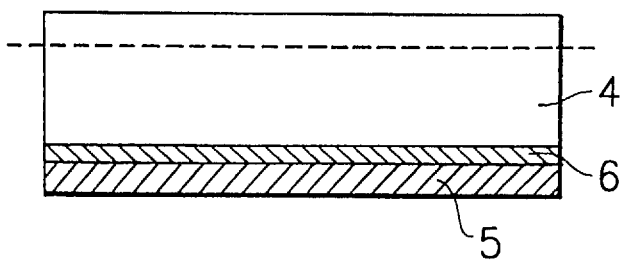

After the deposition of the plasma CVD film or after heat treatment, the other main surface opposite to the main surface on which the plasma CVD has been deposited is mirror-polished, whereby there can be obtained a desired semiconductor wafer which has an excellently persistent gettering capability, an autodoping preventive capability and small stress acting to the wafer with a resultant small warpage thereof (see FIG. 2D). Since the plasma CVD film deposited on the surface can be polished off at much higher speed as compared to the case where a thermal oxide film or an atmospheric pressure CVD oxide film is polished, the plasma CVD film can be easily removed by mirror polishing. Consequently, the flatness of the semiconductor wafer can be maintained.

In the case where the surface opposite to the surface on which a plasma CVD film is to be deposited has been mirror-finished, a subsequent polishing process can be omitted if the plasma CVD is prevented from depositing on the mirror-finished surface.

Moreover, an epitaxial layer may be grown on the semiconductor wafer obtained through the above-described steps by use of a commercially available epitaxial reactor, so that there can be obtained a desired epitaxial wafer which has an excellently persistent gettering capability, an autodoping preventive capability, and a small stress acting to the wafer with a resultant small warpage thereof.

Figure 3A:
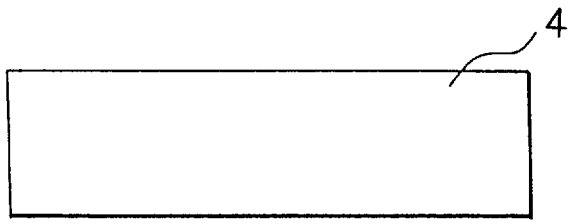
FIGS. 3A–3D are schematic diagram showing a method of manufacturing a silicon epitaxial wafer according to the present invention, wherein the portion above a broken line in FIG. 3C indicates a portion to be removed by mirror polishing.
Figure 3B:
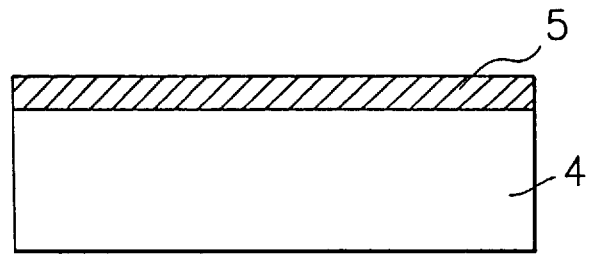
Figure 3C:
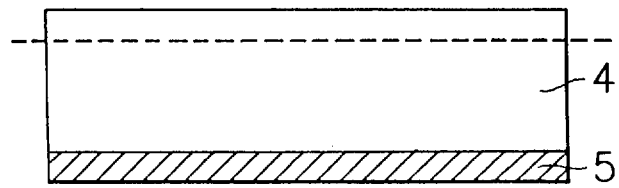
Figure 3D:
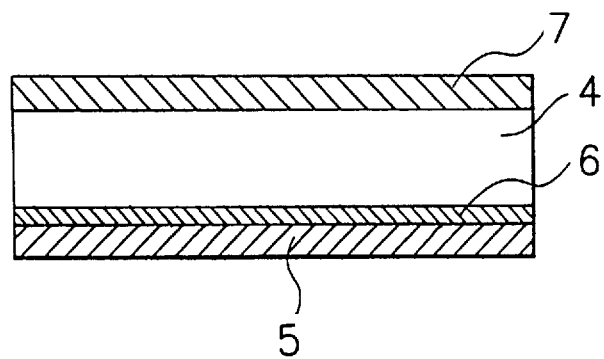

The epitaxial growth process may be used as a replacement of heat treatment given to the semiconductor wafer on which the plasma CVD film is deposited. That is, a semiconductor wafer 4 is prepared as shown in FIG. 3A, and a plasma CVD film 5 is deposited on the first main surface of the semiconductor wafer 4, as shown in FIG. 3B. Subsequently, the second main surface of the semiconductor wafer 4 opposite the first main surface on which the plasma CVD film 5 has been deposited is mirror polished, as shown in FIG. 3C. After that, an epitaxial layer 7 is grown on the mirror-polished second main surface. The epitaxial growth is conducted at a temperature in a range of 800°–1200°, whereby the stress which the plasma CVD film applies to the semiconductor wafer falls within a range of $1 \times 10^8 - 1 \times 10^9$ dyne/cm$^2$. As a result, the portions that receive the stress form a strained layer 6, as shown in FIG. 3D.

EXAMPLE 2

Four kinds of silicon wafers were prepared from a silicon ingot manufactured by the Czochralski method (each wafer had a diameter of 150 mm, a {100} main surface, a thickness of 630 μm, a p-type conductivity, and a resistivity of 0.01 Ω.cm). Silicon oxide film, silicon nitride film or silicon oxynitride film were respectively deposited, as a plasma CVD film, on the first main surfaces of three kinds of wafers by use of a plasma CVD reactor using radio-frequency of 13.56 MHz (Concept-one, product of Novellus Systems Inc.). The remaining one kind of wafer was used as it was without forming the plasma CVD film.

When a silicon oxide film was formed as a plasma CVD film, monosilane and nitrous oxide were supplied as source materials to a plasma reaction chamber while nitrogen was used as a carrier gas, and the silicon oxide film was deposited until its thickness reached 500 nm at a growth temperature of 425° C. and a growth pressure of 3 torr. At this time, a high frequency power of 700 W was supplied to an upper plate located above a wafer in the plasma reaction chamber, while a low frequency power of 300 W was supplied to a lower plate located below the wafer, so that the stress of the silicon oxide film applied to the wafer became equal to $1 \times 10^8$ dyne/cm$^2$.

When a silicon nitride film was formed as a plasma CVD film, monosilane and ammonia were used as source materials. The formation of the silicon nitride film was carried out under the same conditions as for the silicon oxide film until the thickness reached 100 nm so that the stress of the silicon nitride film applied to the wafer became equal to $1 \times 10^8$ dyne/cm$^2$.

When a silicon oxynitride film was formed as a plasma CVD film, monosilane, nitrous oxide and ammonia were used as source materials. The formation of the silicon oxynitride film was carried out under the same conditions as for the silicon oxide film until the thickness reached 300 nm so that the stress of the silicon oxynitride film applied to the wafer became equal to $1 \times 10^8$ dyne/cm$^2$.

The thus-obtained wafers of three kinds had warpages not greater than 3 μm when the stress acting thereon was $1 \times 10^8$ dyne/cm$^2$.

Subsequently, the second surface of each wafer opposite to the first surface on which the plasma CVD was deposited was polished, and an epitaxial film having a thickness of 5 μm was grown at 1100° C. In each of the cases where any kind of the plasma CVD films above-mentioned were formed, the resistivity distribution of the silicon epitaxial layer within the wafer surface was equal to or less than 15%. The transition width (the width of a region which is located in the vicinity of the boundary between an epitaxial layer and a silicon wafer, each having a different dopant concentration, and in which a dopant concentration transits) of the silicon epitaxial layer became about half of that of an epitaxial layer deposited on a wafer having no plasma CVD film.

The resistivity was measured at nine points within the wafer surface, and the resistivity distribution was calculated in accordance with the following equation:

Resistivity distribution (%)=±(M−m)/(M+m)

where M is the maximum value of the measured resistivity, and m is the minimum value of the measured resistivity.

Measurement about the gettering capability was performed as follows. An iron-containing solution was applied to the surface of each of four kinds of wafers that were manufactured under the same conditions as above-described, so that the thus-coated surface of each silicon wafer was intentionally contaminated. Thereafter, the silicon wafers were subjected to heat treatment at a temperature of 1000° C. for one hour, so that iron was diffused into the silicon wafers. Subsequently, the silicon wafers were further subjected to heat treatment at a temperature of 650° C. for ten hours. A silicon wafer intentionally contaminated with iron is dissolved through etching, and the concentration of iron in the solution is measured by chemical analysis. Then, the concentration of iron in each silicon wafer with exclusion of the plasma CVD film was measured.

By using the concentration of iron in the silicon wafer having no plasma CVD film as a reference, a ratio of iron captured by the plasma CVD film was calculated from a measurement value of the iron concentration. The thus-calculated ratio was used as a measure of gettering capability. The results revealed that the gettering capability of the semiconductor wafer on which a plasma CVD film was formed according to the present invention was 93–96%.

As is evident from the test result, the semiconductor wafer on which a plasma CVD film was formed according to the present invention had an excellently persistent gettering capability and an autodoping preventive capability.

Moreover, the amount of an increase in the warpage of the wafer after the formation of the epitaxial layer compared to the warpage before the formation of the epitaxial layer was as low as 5 μm or less. This demonstrates that the semiconductor wafer on which a plasma CVD film was formed according to the present invention had a reduced warpage as compared to the warpage observed when more conventional autodoping films are used.

The present invention is not limited to the above-described embodiment. The above-described embodiment is a mere example, and those having the substantially same structure as that described in the appended claims and providing the similar action and effects are included in the scope of the present invention.

What is claimed is:

1. A method of manufacturing a semiconductor wafer which has a dopant evaporation preventive film formed on one of main surfaces thereof, said method comprising the step of:

forming a plasma CVD film that serves as the dopant evaporation preventive film on the one of the main surfaces by a plasma CVD method, said plasma CVD film being formed from silicon oxide such that the stress between the plasma CVD film and the semiconductor wafer becomes equal to or less than $1 \times 10^7$ dyne/cm$^2$.

2. A method of manufacturing a semiconductor wafer in which a dopant evaporation preventive film is formed on one of main surfaces and a semiconductor thin film is formed on the other main surface by epitaxial growth, said method comprising the steps of:

forming a plasma CVD film that serves as a dopant evaporation preventive film on the one of the main surfaces by a plasma CVD method, said plasma CVD film being formed from silicon oxide such that the stress between the plasma CVD film and the semiconductor wafer becomes equal to or less than $1 \times 10^7$ dyne/cm$^2$; and heat-treating the semiconductor wafer at a temperature lower than a temperature at which the epitaxial growth of the semiconductor thin film is carried out.

3. A method of manufacturing a semiconductor wafer in which a dopant evaporation preventive film is formed on one of main surfaces, said method comprising the steps of:

forming a plasma CVD film that serves as the dopant evaporation preventive film on the one of the main surfaces by a plasma CVD method, said plasma CVD film being formed from silicon oxide such that the stress between the plasma CVD film and the semiconductor wafer becomes equal to or less than $1 \times 10^7$ dyne/cm$^2$; and polishing the other main surface.

4. A method of manufacturing a semiconductor wafer in which a dopant evaporation preventive film is formed on one of main surfaces and a semiconductor thin film is formed on the other main surface by epitaxial growth, said method comprising the steps of:

forming a plasma CVD film that serves as the dopant evaporation preventive film on the one of the main surfaces by a plasma CVD method, said plasma CVD film being formed from silicon oxide such that the stress between the plasma CVD film and the semiconductor wafer becomes equal to or less than $1 \times 10^7$ dyne/cm$^2$;

heat-treating the semiconductor wafer at a temperature lower than a temperature at which the epitaxial growth of the semiconductor thin film is carried out; and polishing the other main surface.

5. A method of manufacturing a semiconductor wafer having a plasma CVD film on one of main surfaces, wherein the plasma CVD film is formed from silicon nitride on one of the main surfaces of the semiconductor wafer so that a stress between the plasma CVD film and the semiconductor wafer falls in a range of $1 \times 10^8 - 1 \times 10^9$ dyne/cm$^2$.

6. A method of manufacturing a semiconductor wafer according to claim 5, wherein the other main surface of the semiconductor wafer on which the plasma CVD film has not been formed is polished after the formation of the plasma CVD film.

7. A method of manufacturing a semiconductor wafer according to claim 5, wherein the plasma CVD film is formed on one of main surfaces of the wafer after the other main surface has been mirror-polished.

8. A method of manufacturing a semiconductor wafer having a plasma CVD film on one of main surfaces, said method comprising the steps of:

forming a plasma CVD film from silicon nitride on the one of the main surfaces of the semiconductor wafer; and heat-treating the semiconductor wafer so that a stress between the plasma CVD film and the semiconductor wafer falls in a range of $1 \times 10^8 - 1 \times 10^9$ dyne/cm$^2$.

9. A method of manufacturing a semiconductor wafer according to claim 8, wherein the other main surface of the semiconductor wafer on which the plasma CVD film has not been formed is polished after the semiconductor wafer is subjected to heat treatment.

10. A method of manufacturing a semiconductor wafer according to claim 8, wherein the plasma CVD film is formed on one of the main surfaces of the wafer after at least the other main surface has been mirror-polished.

11. A semiconductor wafer manufactured by the method described in claim 1.

12. A semiconductor epitaxial wafer in which a semiconductor thin film is formed by epitaxial growth, on one of main surfaces of the semiconductor wafer manufactured by the method described in claim 1, wherein the plasma CVD film is not formed on the one of the main surfaces.

13. A method of manufacturing a semiconductor epitaxial wafer, said method comprising the steps of:

forming a plasma CVD film from silicon oxide on one of main surfaces of a semiconductor wafer such that the stress between the plasma CVD film and the semiconductor wafer becomes equal to or less than $1 \times 10^7$ dyne/cm$^2$;

heat-treating the semiconductor wafer at a predetermined temperature;

polishing the other main surface of the semiconductor wafer; and forming a semiconductor thin film by epitaxial growth on the other main surface at a temperature equal to or less than 1000° C., wherein the predetermined temperature for the heat treatment is lower than the temperature for epitaxial growth of the semiconductor thin film, and wherein the above-described steps are performed in this sequence.

14. A method of manufacturing a semiconductor epitaxial wafer comprising the step of:

growing, through epitaxial growth, a semiconductor thin film on the one of the main surfaces, on which the plasma CVD film is not formed, of a semiconductor wafer manufactured in accordance with the method according to claim 5.

15. A method of manufacturing a semiconductor epitaxial wafer comprising the step of:

growing, through epitaxial growth, a semiconductor thin film on the one of the main surfaces, on which the plasma CVD film is not formed, of a semiconductor wafer manufactured in accordance with the method according to claim 8.

* * * * *